(12) United States Patent
Price et al.

(10) Patent No.: US 10,003,726 B2
(45) Date of Patent: Jun. 19, 2018

(54) ILLUMINATION MODULE FOR NEAR EYE-TO-EYE DISPLAY SYSTEM

(71) Applicant: Microsoft Technology Licensing, LLC, Redmond, WA (US)

(72) Inventors: Raymond Kirk Price, Redmond, WA (US); Ravi Kiran Nalla, San Jose, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days. days.

(21) Appl. No.: 15/081,750

(22) Filed: Mar. 25, 2016

(65) Prior Publication Data
US 2017/0280031 A1   Sep. 28, 2017

(51) Int. Cl.
*H04N 5/222* (2006.01)
*H04N 5/225* (2006.01)
(Continued)

(52) U.S. Cl.
CPC ............ *H04N 5/2256* (2013.01); *F21V 5/02* (2013.01); *F21V 5/04* (2013.01); *F21V 7/0008* (2013.01); *G01S 7/4814* (2013.01); *G01S 17/08* (2013.01); *G01S 17/89* (2013.01); *G02B 19/0014* (2013.01); *G02B 19/0052* (2013.01); *G02B 19/0061* (2013.01); *G02B 27/0172* (2013.01); *G02B 27/0176* (2013.01); *G06T 19/006* (2013.01); *H01S 5/4031* (2013.01); *H04N 5/2253* (2013.01); *H04N 13/0203* (2013.01);
(Continued)

(58) Field of Classification Search
None
See application file for complete search history.

(56) References Cited

U.S. PATENT DOCUMENTS

| | | |
|---|---|---|
| 5,076,664 A | 12/1991 | Migozzi |
| 5,539,422 A | 7/1996 | Heacock et al. |

(Continued)

FOREIGN PATENT DOCUMENTS

| | | |
|---|---|---|
| DE | 19944042 A1 | 4/2001 |
| WO | 1997042560 A1 | 11/1997 |
| WO | 2014157847 A1 | 10/2014 |

OTHER PUBLICATIONS

U.S. Appl. No. 15/081,799, of Price, et al., filed Mar. 25, 2016.
(Continued)

*Primary Examiner* — Twyler Haskins
*Assistant Examiner* — Wesley Chiu
(74) *Attorney, Agent, or Firm* — Arent Fox LLP

(57) ABSTRACT

An illumination module can comprise a circuit board, a semiconductor-based light source mounted to the circuit board, an encasing mounted to the circuit board, and one or more optical surfaces at least partially contained within the encasing. The semiconductor-based light source can emit light in a first illumination pattern. The one or more optical surfaces can be collectively configured to receive the light from the edge-emitting semiconductor-based light source. The one or more optical surfaces can further be collectively configured to condition and redirect the light, and to output the conditioned and redirected light from the illumination module in a second illumination pattern different from the first illumination pattern.

14 Claims, 9 Drawing Sheets

(51) Int. Cl.

| | | |
|---|---|---|
| *F21V 5/02* | (2006.01) | |
| *F21V 5/04* | (2006.01) | |
| *F21V 7/00* | (2006.01) | |
| *G02B 27/01* | (2006.01) | |
| *G06T 19/00* | (2011.01) | |
| *H04N 13/02* | (2006.01) | |
| *G01S 17/08* | (2006.01) | |
| *H01S 5/40* | (2006.01) | |
| *G02B 19/00* | (2006.01) | |
| *G01S 17/89* | (2006.01) | |
| *G01S 7/481* | (2006.01) | |

(52) U.S. Cl.
CPC ............... *G02B 2027/015* (2013.01); *G02B 2027/0138* (2013.01)

(56) References Cited

U.S. PATENT DOCUMENTS

| | | | |
|---|---|---|---|
| 6,870,580 B2 | 3/2005 | Yoneyama | |
| 7,158,096 B1 | 1/2007 | Spitzer | |
| 7,440,114 B2 | 10/2008 | Klooster et al. | |
| 7,450,310 B2* | 11/2008 | McGuire | G02B 27/0172 |
| | | | 359/630 |
| 8,488,246 B2 | 7/2013 | Border et al. | |
| 8,727,567 B1* | 5/2014 | Tien | H01L 25/0753 |
| | | | 362/235 |
| 8,786,686 B1 | 7/2014 | Amirparviz | |
| 2002/0080117 A1* | 6/2002 | Son | G06F 3/0317 |
| | | | 345/163 |
| 2004/0240798 A1* | 12/2004 | Baur | G02B 6/4214 |
| | | | 385/88 |
| 2006/0256086 A1* | 11/2006 | Xie | G06F 3/03543 |
| | | | 345/166 |
| 2009/0262368 A1* | 10/2009 | Leong | G01S 7/4811 |
| | | | 356/615 |
| 2013/0201289 A1* | 8/2013 | Billerbeck | G01S 7/4814 |
| | | | 348/46 |
| 2013/0265770 A1 | 10/2013 | Breidenassel et al. | |
| 2015/0078001 A1* | 3/2015 | Patil | G02B 27/48 |
| | | | 362/259 |
| 2015/0229912 A1 | 8/2015 | Masalkar et al. | |
| 2016/0069999 A1* | 3/2016 | Lee | H04N 13/0271 |
| | | | 356/5.01 |
| 2016/0077338 A1 | 3/2016 | Robbins et al. | |
| 2016/0313560 A1* | 10/2016 | Kawamura | G02B 27/0172 |
| 2016/0329679 A1* | 11/2016 | Bohn | H01S 5/0071 |
| 2016/0352071 A1* | 12/2016 | Hogan | H01S 5/18388 |
| 2016/0359296 A1* | 12/2016 | Wong | H01S 5/02292 |
| 2017/0131765 A1* | 5/2017 | Perek | G02B 5/3083 |

OTHER PUBLICATIONS

Marani, et al., "A Compact 3D Omnidirectional Range Sensor of High Resolution for Robust Reconstruction of Environments", in Journal of Sensors, vol. 15, Issue 2, Jan. 22, 2015, pp. 2283-2308.
"International Search Report and Written Opinion Issued in PCT Application No. PCT/US2017/023281", dated Jun. 22, 2017, 11 Pages.

* cited by examiner

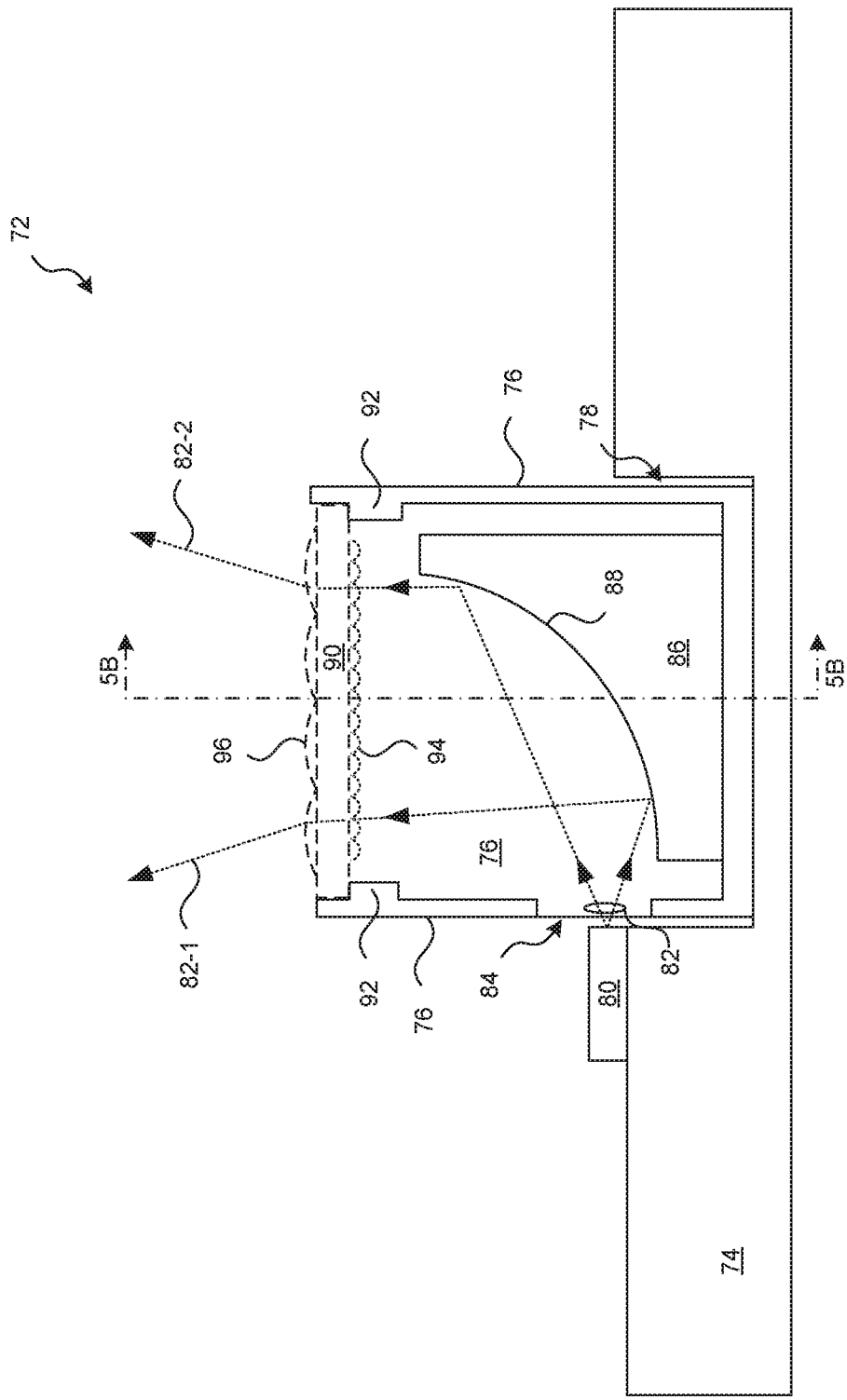

ILLUMINATION MODULE FOR NEAR EYE-TO-EYE DISPLAY SYSTEM

BACKGROUND

Depth sensing technology can be used to determine a person's location in relation to nearby objects or to generate an image of a person's immediate environment in three dimensions (3D). An example of depth sensing technology is a time-of-flight (ToF) depth camera. A ToF camera has a light source to emit light onto nearby objects. Light reflected off surfaces of the objects can be captured by the ToF camera. The time it takes for the light to travel from the light source of the ToF camera and reflect back from an object is converted into a depth measurement (i.e., distance to the object), which can be processed to map physical surfaces in the user's environment and, if desired, to render a 3D image of the user's environment.

Conventional light sources are bulky structures that require complex manual assembly. For example, the dimensions of a conventional light source may be 60×25×35 millimeters, which is physically too large for some applications. The light sources are bulky in part because they utilize physically large laser light sources, have large optical working distances, and include optical elements that must be manually inserted into the light sources. As such, the resulting 3D sensing camera is physically bulky and heavy, and may not be usable in wearable or mobile applications. Additionally, processes for manufacturing existing light sources cannot feasibly be combined with automated processes used to assemble electronic components of a depth sensor. Hence, processes for manufacturing existing light sources are cost prohibitive and result in bulky structures that are poorly suited for some applications such as depth sensors (for use in mobile or wearable applications) and are an impediment to further miniaturization of such sensors.

SUMMARY

Introduced here are at least one apparatus and at least one method. The at least one apparatus includes an illumination module, and the at least one method is a method of manufacturing the illumination module. The illumination module introduced here is suitable for applications such as near-to-eye display systems, and can be manufactured using automated processes.

In some embodiments, the illumination module can comprise a circuit board, a semiconductor-based light source mounted to the circuit board, an encasing (i.e., optical housing) mounted to the circuit board, and one or more optical surfaces at least partially contained within the encasing. The semiconductor-based light source can emit light in a first illumination pattern. The one or more optical surfaces can be collectively configured to receive, redirect, and/or collimate the light from the edge-emitting semiconductor-based light source. The one or more optical surfaces can further be collectively configured to condition and redirect the light, and to output the conditioned and redirected light from the illumination module in a second illumination pattern different from the first illumination pattern.

In certain embodiments, the illumination module may be implemented in a near-eye display device, such as a head-mounted display (HMD) device, such as a Virtual Reality or Augmented Reality system. In certain embodiments, the illumination module may be implemented in conjunction with a camera to perform depth sensing for the HMD device.

In certain embodiments, methods of manufacturing the illumination module include using a computer controlled robotic transfer device to mount a combination of the edge-emitting semiconductor-based light source, encasing, or optical elements to a circuit board. In certain embodiments, some of the optical elements may be manually inserted into the encasing prior to using the computer controlled robotic transfer device to mount the encasing to the circuit board.

Other aspects of the disclosed embodiments will be apparent from the accompanying figures and detailed description.

This Summary is provided to introduce a selection of concepts in a simplified form that are further explained below in the Detailed Description. This Summary is not intended to identify key features or essential features of the claimed subject matter, nor is it intended to be used to limit the scope of the claimed subject matter.

BRIEF DESCRIPTION OF THE DRAWINGS

One or more embodiments of the present disclosure are illustrated by way of example and not limitation in the figures of the accompanying drawings, in which like references indicate similar elements.

FIG. 5A shows a side view of an illumination module assembly according to another embodiment.

DETAILED DESCRIPTION

Figure 1:
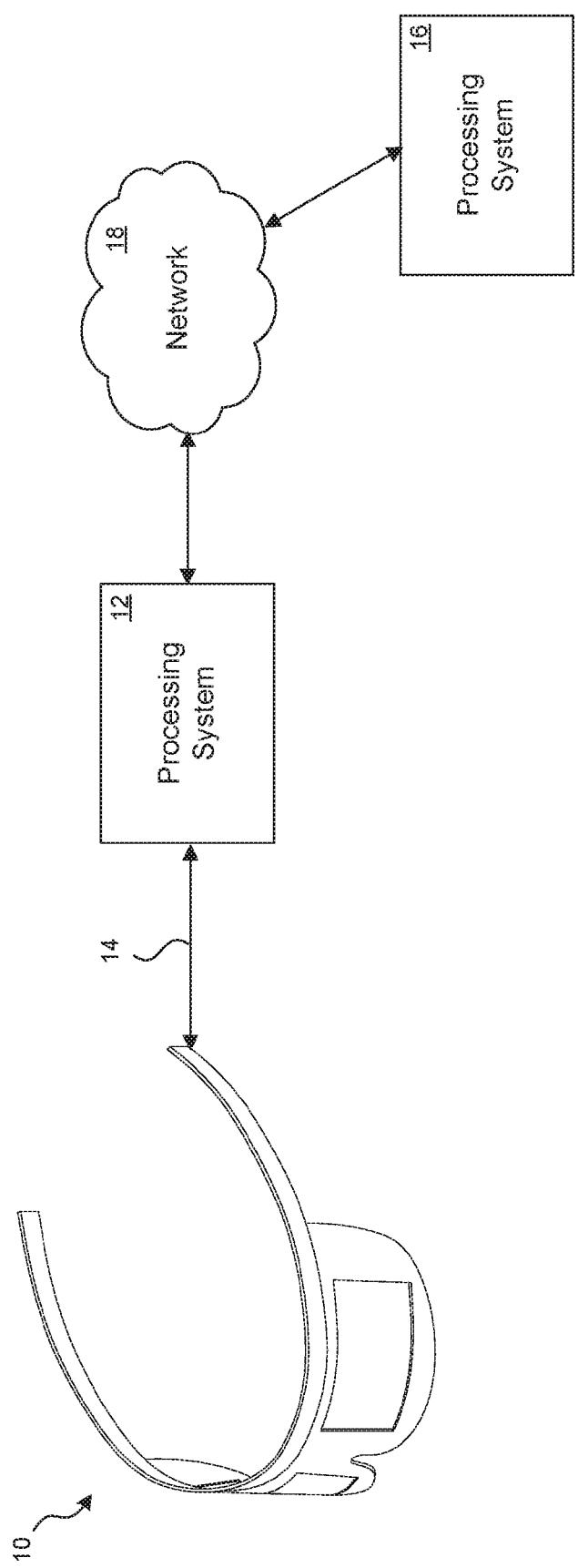
FIG. 1 shows an example of an environment in which a virtual reality (VR) or augmented reality (AR) enabled head-mounted display device (hereinafter "HMD device") can be used.

In this description, references to "an embodiment," "one embodiment" or the like mean that the particular feature, function, structure or characteristic being described is included in at least one embodiment introduced here. Occurrences of such phrases in this specification do not necessarily all refer to the same embodiment. On the other hand, the embodiments referred to also are not necessarily mutually exclusive.

The following description generally assumes that a "user" of a display device is a human. Note, however, that a display device of the disclosed embodiments can potentially be used by a user that is not human, such as a machine or an animal. Hence, the term "user" can refer to any of those possibilities, except as may be otherwise stated or evident from the context. Further, the term "optical receptor" is used here as a general term to refer to a human eye, an animal eye, or a machine-implemented optical sensor designed to detect an image in a manner analogous to a human eye.

Virtual reality (VR) or augmented reality (AR) enabled head-mounted display (HMD) devices and other near-to-eye display systems may include transparent display elements that enable users to see concurrently both the real world around them and AR content displayed by the HMD devices. An HMD device may include components such as light-emission elements (e.g., light emitting diodes (LEDs)), waveguides, various types of sensors, and processing electronics. HMD devices may further include one or more imager devices to generate images (e.g., stereo pair images for 3D vision) in accordance with the environment of a user wearing the HMD device, based on measurements and calculations determined from the components included in the HMD device.

An HMD device may also include a depth sensing system that resolves distance between the HMD device worn by a user and physical surfaces of objects in the user's immediate vicinity (e.g., walls, furniture, people and other objects). The depth sensing system may include a ToF camera that is used to produce a 3D image of the scene. The captured image has pixel values corresponding to the distance between the HMD device and points of the scene.

The HMD device may have an imager device that generates holographic images based on the resolved distances, for example, so that holographic objects appear at specific locations relative to physical objects in the user's environment. The HMD device may also have one or more display devices to display the generated images overlaid on the view of an optical receptor of a user when the HMD device is worn by the user. Specifically, one or more transparent waveguides of the HMD device can be arranged so that they are positioned to be located directly in front of each eye of the user when the HMD device is worn by the user, to emit light representing the generated images into the eyes of the user. Wth such a configuration, images generated by the HMD device can be overlaid on the user's three-dimensional view of the real world.

FIGS. 1 through 7 and related text describe certain embodiments of an illumination module in the context of near-to-eye display systems. However, the disclosed embodiments are not limited to near-to-eye display systems and have a variety of possible applications, including any active illumination systems (i.e., actively using light sources) such as used in active light projection systems or any active camera modules. All such applications, improvements, or modifications are considered within the scope of the concepts disclosed here.

FIG. 1 schematically shows an example of an environment in which an HMD device can be used. In the illustrated example, the HMD device 10 is configured to communicate data to and from an external processing system 12 through a connection 14, which can be a wired connection, a wireless connection, or a combination thereof. In other use cases, however, the HMD device 10 may operate as a standalone device. The connection 14 can be configured to carry any kind of data, such as image data (e.g., still images and/or full-motion video, including 2D and 3D images), audio, multimedia, voice, and/or any other type(s) of data. The processing system 12 may be, for example, a game console, personal computer, tablet computer, smartphone, or other type of processing device. The connection 14 can be, for example, a universal serial bus (USB) connection, W-Fi connection, Bluetooth or Bluetooth Low Energy (BLE) connection, Ethernet connection, cable connection, digital subscriber line (DSL) connection, cellular connection (e.g., 3G, LTE/4G or 5G), or the like, or a combination thereof. Additionally, the processing system 12 may communicate with one or more other processing systems 16 via a network 18, which may be or include, for example, a local area network (LAN), a wide area network (WAN), an intranet, a metropolitan area network (MAN), the global Internet, or combinations thereof.

Figure 2:
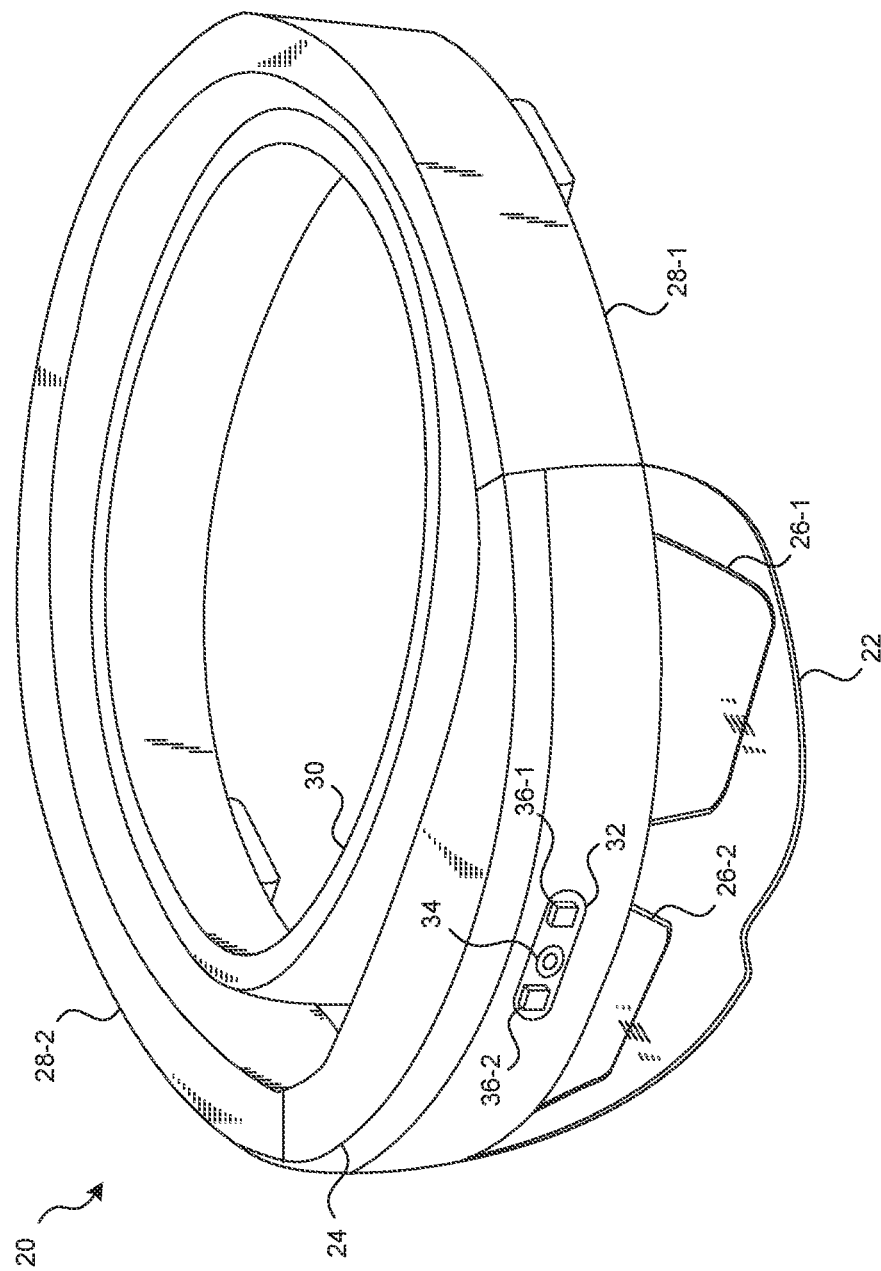
FIG. 2 illustrates a perspective view of an example of an HMD device.

FIG. 2 shows a perspective view of an HMD device 20 that can incorporate the features being introduced here, according to certain embodiments. The HMD device 20 can be an embodiment of the HMD device 10 of FIG. 1. The HMD device 20 has a protective sealed visor assembly 22 (hereafter the "visor assembly 22") that includes a chassis 24. The chassis 24 is the structural component by which display elements, optics, sensors and electronics are coupled to the rest of the HMD device 20. The chassis 24 can be formed of molded plastic, lightweight metal alloy, or polymer, for example.

The visor assembly 22 includes left and right AR displays 26-1 and 26-2, respectively. The AR displays 26-1 and 26-2 are configured to display images overlaid on the user's view of the real-world environment, for example, by projecting light into the user's eyes. Left and right side arms 28-1 and 28-2, respectively, are structures that attach to the chassis 24 at the left and right open ends of the chassis 24, respectively, via flexible or rigid fastening mechanisms (including one or more clamps, hinges, etc.). The HMD device 20 includes an adjustable headband (or other type of head fitting) 30, attached to the side arms 28-1 and 28-2, by which the HMD device 20 can be worn on the user's head.

The chassis 24 may include various fixtures (e.g., screw holes, raised flat surfaces, etc.) to which a sensor assembly 32 and other components can be attached. In some embodiments the sensor assembly 32 is contained within the visor assembly 22 and mounted to an interior surface of the chassis 24 via a lightweight metal frame (not shown). A circuit board (not shown in FIG. 2) bearing electronics components of the HMD 20 (e.g., microprocessor, memory) can also be mounted to the chassis 24 within the visor assembly 22.

The sensor assembly 32 includes a depth camera 34 and one or more associated illumination modules 36 (collectively referred to as illumination modules 36 and individually as illumination module 36-1 through 36-N) of a depth sensing system. The illumination modules 36 emit light to illuminate a scene. Some of the light reflects off surfaces of objects in the scene, and returns back to the depth camera 34. The depth camera 34 captures the reflected light that includes at least a portion of the light from the illumination modules 36.

The "light" emitted from the illumination modules 36 is electromagnetic radiation suitable for depth sensing and should not directly interfere with the user's view of the real world. As such, the light emitted from the illumination modules 36 is typically not part of the visible spectrum. Examples of the emitted light include infrared (IR) light to make the illumination unobtrusive. Sources of the light emitted by the illumination modules 36 may include LEDs such as super-luminescent LEDs, laser diodes, or any other semiconductor-based light source with sufficient power output.

The depth camera 34 may be or include any image sensor configured to capture light emitted by the illumination modules 36. The depth camera 34 may include a lens that gathers reflected light and images the environment onto the image sensor. An optical bandpass filter may be used to pass only the light with the same wavelength as the light emitted by the illumination modules 36. For example, in a ToF depth sensing system, each pixel of the depth camera 34 may measure the time light has taken to travel from the illumination modules 36 to surfaces of objects and back to the depth camera 34. Any of various approaches known to persons skilled in the art could be used for determining the timing and corresponding depth calculations.

The HMD device 20 includes electronics circuitry (not shown in FIG. 2) to control and synchronize the operations of the depth camera 34 and the illumination modules 36, and to perform associated data processing functions. The circuitry may include, for example, one or more processors and one or more memories. As a result, the HMD device 20 can provide surface reconstruction to model the user's environment, or be used as a sensor to receive human interaction information. Wth such a configuration, images generated by the HMD device 20 can be properly overlaid on the user's 3D view of the real world to provide a virtual or augmented reality. Note that in other embodiments the aforementioned components may be located in different locations on the HMD device 20. Additionally, some embodiments may omit some of the aforementioned components and/or may include additional components not discussed above nor shown in FIG. 2.

Figure 3:
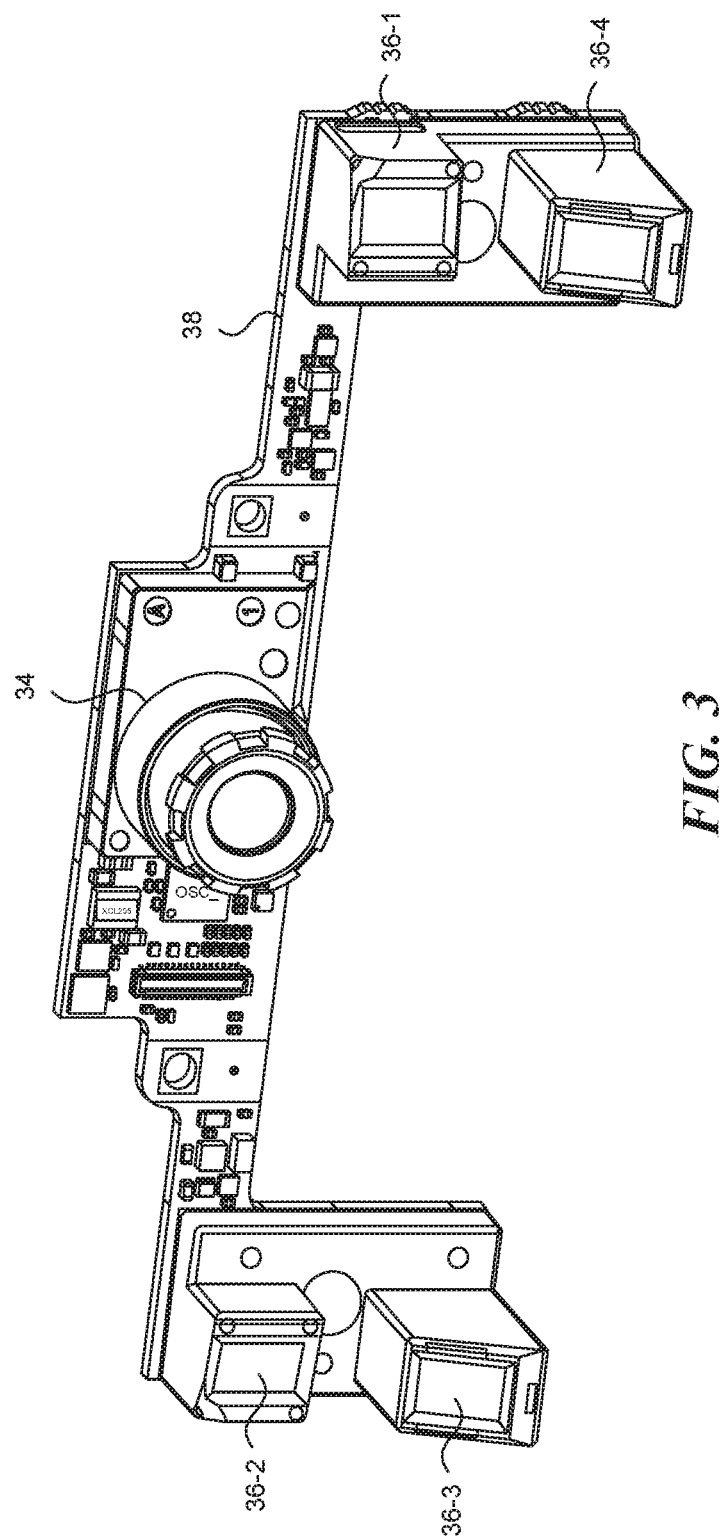
FIG. 3 shows a front view of a portion of a sensor assembly of an HMD device.

FIG. 3 shows a portion of the sensor assembly 32 of the HMD device 20. In particular, the sensor assembly 32 includes sensors and electronics mounted to a circuit board 38, which can be mounted to the chassis 24 as mentioned above. The sensors mounted to the circuit board 38 include the depth camera 34 and the illumination modules 36-1 through 36-4. Other sensors that may be included in the sensor assembly 32 but are not shown in the figures or discussed further may include head-tracking cameras, visible spectrum cameras, ambient light sensors, and the like. Some or all of these other sensors may also be mounted to the sensor assembly 32.

In the illustrated embodiment, illumination modules 36-1 and 36-2 are positioned such that they emit light in slightly outwardly divergent directions with respect to the depth camera 34; whereas illumination modules 36-3 and 36-4 are positioned such that they emit light directly forward (i.e., parallel to the user's head-pointing vector). Moreover, illumination from illumination modules 36-3 and 36-4 has a reduced field of illumination and increased range from the depth camera 34 that is greater than the range of illumination from illumination modules 36-1 and 36-2 from the depth camera 34. Hence, illumination modules 36 are collectively configured to illuminate the user's field of view, although the illumination may not be visible to the user. The locations and positions of the illumination modules 36 and the depth camera 34 relative to each other as shown in FIG. 3 are merely examples of a configuration used for depth sensing; other configurations are possible in the context of the technique introduced here.

Figure 4A:
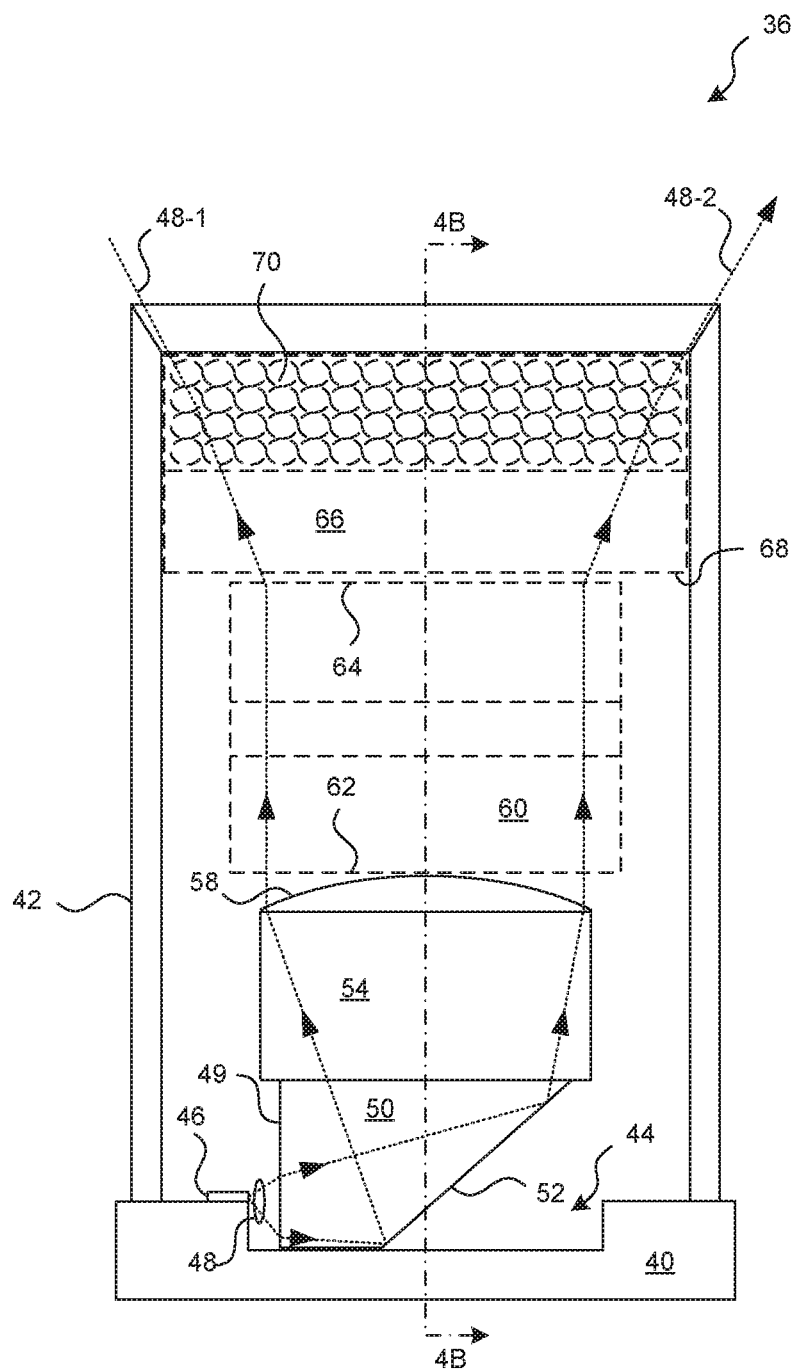
FIG. 4A shows a side view of an illumination module assembly according to an embodiment.
Figure 4B:
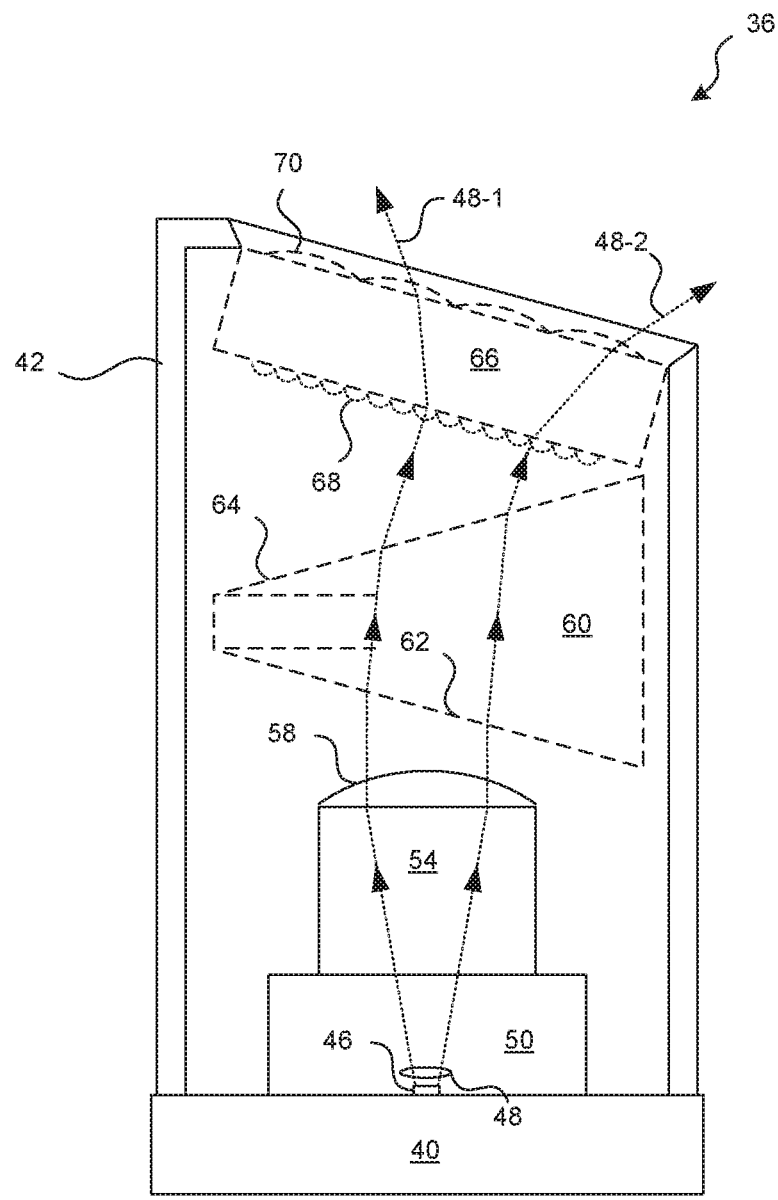
FIG. 4B shows a front view of the illumination module of FIG. 4A.

FIG. 4A shows a side view of an illumination module 36 according to at least one embodiment. FIG. 4B shows a front view of the illumination module 36 of FIG. 4A. The illumination module 36 includes a circuit board 40 (e.g., circuit board 38 in FIG. 3) and an encasing 42 mounted in a cavity 44 of the circuit board 40. In certain embodiments, the encasing 42 may be mounted to a top surface of the circuit board 40 rather than in the cavity 44. An adhesive (e.g., epoxy) may be used to mount the encasing 42 to the circuit board 40.

An edge-emitting semiconductor-based light source 46 (hereafter "semiconductor light source 46") is mounted to the circuit board 40. The disclosed semiconductor light source 46 may include one or more edge-emitting laser diodes (commonly referred to as in-plane lasers) to emit light that propagates in a direction substantially parallel to the top surface of the circuit board 40. The emitted light may be infrared light or any other light suitable for active illumination systems. The semiconductor light source 46 may be contained within the encasing 42, or it may be located external to the encasing 42 but positioned to emit light 48 into the encasing 42. In certain embodiments, the cavity 44 is cut into the top surface of the circuit board 40, to allow the light 48 to naturally expand into the cavity 44, without having to increase the Z-height position of the light source 46 from the circuit board 40.

The disclosed semiconductor light sources emit light in accordance with an illumination pattern. The illumination pattern may have properties including divergence, beam quality, amplitude, and the like. For example, the illumination pattern of light emitted from the semiconductor light source 46 includes a direction that is parallel or substantially parallel to the surface of the circuit board 40 on which the semiconductor light source 46 is mounted. A "substantially parallel" direction is a direction where a parallel component of the direction relative to a surface is greater than a perpendicular component of the direction relative to the surface.

The illumination module 36 includes multiple optical elements that are at least partially contained in the encasing 42. In certain embodiments, the optical elements may include one or more mirrors, lenses, prisms, and/or other components. Each optical element includes one or more optical surfaces that may input or output light emitted from a semiconductor light source as the light propagates through an illumination module.

In certain embodiments, optical elements of an illumination module 36 act to condition or redirect light to form a desired field of illumination. To "condition" the light refers to changing the orientation of light rays relative to each other in a beam of light. For example, to condition light may affect divergence or convergence of light rays to collimate or de-collimate the light. To "redirect" the light refers to changing the direction of a beam of light. In certain embodiments, light may be redirected reflectively (e.g., turning) or transmissively (e.g., steering), or both.

In the embodiment illustrated in FIGS. 4A and 4B, the optical elements 50 and 54 collectively form an optical assembly. The optical assembly includes optical surfaces 49, 52, and 58. The optical element 50 (shown as a turning prism) includes a turning reflector such as the optical surface 52 that acts to turn (e.g., reflect) the generally horizontally propagating light from the light source upward, away from the circuit board 40. In certain embodiments, the turning reflector may include a flat or curved mirror.

A collimation optic is defined by the optical surfaces 49 and 58. As such, the optical assembly forms a collimation optic having a folded optical design, where the turning reflector (i.e., optical surface 52) is positioned within an optical path of the light 48 propagating through the optical assembly. Specifically, the optical surface 49 refracts the light 48 received from the semiconductor light source 46, and the optical surface 58 collimates the light 48 received from the optical surface 52. Thus, the collimating optic has two optical surfaces 49 and 58 that receive and output the light, respectively, and collectively collimate the light 48. As such, the light 48 that propagates through the optical assembly is redirected and conditioned compared to the illumination pattern of the light 48 emitted from the semiconductor light source 46.

A prism 60 having a wedge shape (hereafter "wedge prism 60") is contained within the encasing 42 and receives the light 48 from the optical assembly (combination of 50 and 54). The wedge prism 60 acts to transmissively redirect the light 48 received from the optical assembly. Specifically, the wedge prism 60 has two optical surfaces 62 and 64 that receive and output the light, respectively, and collectively act to refract and redirect the light 48 from the optical assembly. As such, the light 48 that propagates through the wedge prism 60 is output in an illumination pattern that is reflectively redirected, collimated, and transmissively redirected compared to the illumination pattern of the light 48 emitted from the semiconductor light source 46.

A diffuser 66 is mounted to an open end of the encasing 42 and is partially contained within the encasing 42, essentially forming a cap to the encasing 42. The diffuser 66 receives the conditioned and redirected light 48 from the wedge prism 60. The diffuser 66 diffuses the light 48 received from the wedge prism 60. Any suitably designed diffuser may be used to create a field of illumination desired for a particular application. Specifically, the diffuser 66 has two optical surfaces 68 and 70 that receive and output the light, respectively, and collectively act to diffuse the light 48 from the wedge prism 60. As such, the light 48 that propagates through the diffuser 66 is output in an illumination pattern that is refracted, reflectively redirected, collimated, transmissively redirected, and diffused in comparison to the illumination pattern of the light 48 emitted from the semiconductor light source 46.

As a result, light emitted from an illumination module of certain embodiments propagates away from a circuit board on which an encasing of the illumination module is mounted. For example, the light 48 emitted from the illumination module 36 propagates away from the circuit board 40. In certain embodiments, light emitted from an illumination module has an illumination pattern direction such that a perpendicular component of the direction is greater than a parallel component of the direction relative to a circuit board of the illumination module. For example, the illumination pattern of the light 48 emitted from the illumination module 36 has a direction that is substantially perpendicular to the circuit board 40.

Configurations other than that shown in FIGS. 4A and 4B are also possible in accordance with the technique introduced here. For example, the wedge prism 60, the diffuser 66, or both are optional. For instance, in certain embodiments, a turning mirror could be placed in close proximity to an edge-emitting laser diode to redirect a laser beam normal to a surface of the circuit board, followed by a collimation optic and diffuser. Accordingly, the illumination module 36 may include any number and type of optical elements with suitable optical properties for particular applications.

In certain embodiments, the optical elements of an illumination module may include any number or type of optical surfaces that collectively condition and redirect light emitted from a semiconductor light source. For example, the optical surfaces 49, 52, 58, 62, 64, 68, and 70 are at least partially contained within the encasing 42 and are collectively configured to receive, condition, and redirect the light emitted from the semiconductor light source 46. As a result, the illumination module 36 outputs the conditioned and redirected light 48 in an illumination pattern different from the illumination pattern of the light 48 emitted from the semiconductor light source 46.

The number, types, and ordered combination of optical surfaces shown in FIGS. 4A and 4B can be varied from that shown, in accordance with the technique introduced here. In certain embodiments, the illumination module 36 includes more than three optical surfaces that input or output the light 48, and up to seven or eight optical surfaces, or combinations thereof. In certain embodiments, different optical surfaces of the illumination module 36 are configured to separately or collectively condition or redirect the light 48. For example, three different optical surfaces of the illumination module 36 may receive or output the light 48, and separately collimate, reflectively redirect, and transmissively redirect the light 48.

Figure 5B:
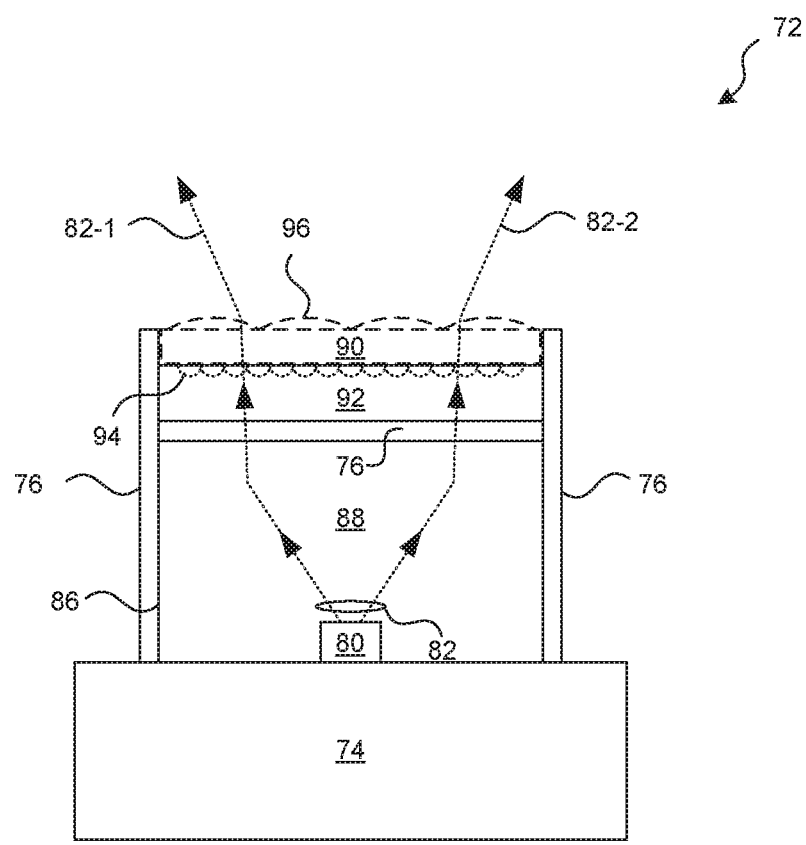
FIG. 5B shows a front view of the illumination module of FIG. 5A.

FIGS. 5A and 5B show an illumination module 72 according to another embodiment. Among other features, the embodiment of FIGS. 5A and 5B has fewer optical surfaces and can be mass-manufactured more easily than the embodiment of FIGS. 4A and 4B. For example, as demonstrated below, the optical elements 50 and 54, as well as the wedge prism 60 of illumination module 36 could be replaced by a single parabolic reflective optical element in illumination module 72. FIG. 5A shows a side view of the illumination module 72, while FIG. 5B shows a front view of the illumination module 72 of FIG. 5A. The illumination module 72 includes a circuit board 74 and an encasing 76 mounted in a cavity 78 of the circuit board 74. In certain embodiments, the encasing 76 may be mounted to the top surface of the circuit board 74 rather than in the cavity 78. An adhesive (e.g., epoxy) may be used to mount the encasing 76 to the circuit board 74.

An edge-emitting semiconductor-based light source 80 (hereafter "semiconductor light source 80"), such as an edge-emitting laser diode, is mounted to the circuit board 74. The semiconductor light source 80 is located external to the encasing 76 but positioned to emit light 82 into the encasing 76 through an opening 84. In certain embodiments, the cavity 78 is cut into the top surface of the circuit board 74, to allow the light 82 to naturally expand into the cavity 78. In certain embodiments, the semiconductor light source 80 may be contained within the encasing 76. The illumination module 72 includes one or more optical elements that are at least partially contained in the encasing 76.

The optical elements include a parabolic mirror 86 contained within the encasing 76. An optical surface 88 of the parabolic mirror 86 receives the light 82 from the semiconductor light source 80. The optical surface 88 acts to collimate and redirect (e.g., turn and/or steer) the light 82 received from the semiconductor light source 80. As such, the light 82 that is received by the parabolic mirror 86 is reflected in an illumination pattern that is collimated and redirected in comparison to the illumination pattern of the light 82 emitted from the semiconductor light source 80.

A diffuser 90 is mounted to an open end of the encasing 76 and is partially contained within the encasing 76, essentially forming a cap to the encasing 76. The diffuser 90 receives the conditioned and redirected light 82 from the parabolic mirror 86. The encasing 76 has a ledge structure 92 that extends from the interior sidewalls of the encasing 76 towards the center of the encasing 76. In certain embodiments, the diffuser 90 sits atop a surface of the ledge structure 92. The diffuser 90 diffuses the light 82 received from the parabolic mirror 86. Specifically, the diffuser 90 has two optical surfaces 94 and 96 that input and output the light 82, respectively, and collectively act to diffuse the light 82 from the parabolic mirror 86. As such, the light 82 that propagates through the diffuser 90 is output in an illumination pattern that is diffused, reflectively redirected, collimated, and/or transmissively redirected in comparison to the illumination pattern of the light 82 emitted from the semiconductor light source 80.

As a result, the light 82 emitted from the illumination module 72 propagates away from the circuit board 74. In certain embodiments, light emitted from an illumination module 72 has an illumination pattern that has a direction such that a perpendicular component of the direction relative to a circuit board 74 is greater than a parallel component of the direction relative to a circuit board 74. As such, the illumination pattern of the light 82 emitted from the illumination module 72 has a direction that is substantially perpendicular to the circuit board 74. In comparison to the illumination module 36, the illumination module 72 requires fewer optical components, allows for more automated assembly, has a smaller physical footprint, and allows for tighter alignment tolerances of the illumination module 72 to the semiconductor light source 80 due to the automated assembly.

The number, types, and ordered combination of optical surfaces shown in FIGS. 5A and 5B can be varied from that shown, in accordance with the technique introduced here. For example, the diffuser 90 is optional. The illumination module 72 may include any number and type of optical elements with suitable optical properties for particular applications.

In certain embodiments, the optical elements of the illumination module 72 may include any number or type of optical surfaces that are collectively configured to condition and redirect the light 82 emitted from the semiconductor light source 80. For example, the optical surfaces 88, 94, and 96 are at least partially contained within the encasing 76 and are collectively configured to receive, condition, and redirect the light 82 emitted from the semiconductor light source 80. As a result, the illumination module 72 outputs the conditioned and redirected light 82 in an illumination pattern different from the illumination pattern of the light 82 emitted from the semiconductor light source 80.

The number, types, and ordered combination of optical surfaces of the illumination module 72 of FIGS. 5A and 5B are not limited to the assembly shown. In certain embodiments, the illumination module 72 includes only one optical surface, no more than three optical surfaces, or combinations thereof, that input or output the light 82. In certain embodiments, only one optical surface is configured to collimate and redirect the light 82. In certain embodiments, different optical surfaces of the illumination module 72 are combined to separately or collectively condition or redirect the light 82.

In certain embodiments, the illumination modules are of a suitable size to mount onto or into compact electronic devices such as the HMD device 20. For example, the illumination module 36 may have dimensions of 12×6×8 millimeters, and the illumination module 72 may have dimensions of 3×4×3 millimeters. As such, manufacturing the illumination modules 36 or 72 involves assembly of relatively small components including an edge-emitting semiconductor-based light source, optical elements, and an encasing all mounted to a circuit board.

The disclosed illumination modules enable assembly by a computer controlled transfer device of the type used for high speed, high precision placing of electronic components such as capacitors, resistors, and integrated circuits onto circuit boards for computers, consumer electronics, and the like. Examples of a computer controlled transfer device include surface mount technology (SMT) component placement systems, which are commonly referred to as pick-and-place machines (P&Ps). In certain embodiments, for example, the edge-emitting semiconductor-based light source may be mounted to a circuit board by using chip-on-board (COB) techniques, and/or the individual optical elements may be mounted to the illumination module by using P&P techniques.

Methods of manufacturing an illumination module by a computer controlled robotic transfer device may include mounting any combination of an edge-emitting laser diode, encasing, or optical elements to a circuit board. In certain embodiments, one or more optical elements may be manually inserted into the encasing, and then the encasing including the one or more optical elements is mounted to the circuit board.

Figure 6:
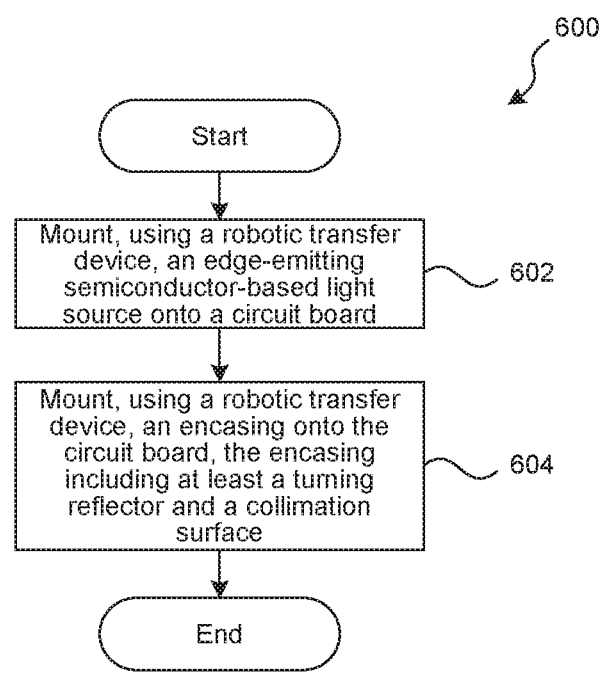
FIG. 6 illustrates an example of a method of manufacturing an illumination module by a computer controlled robotic transfer device.

FIG. 6 illustrates an example of a method 600 of manufacturing the illumination module 36 by using one or more computer controlled robotic transfer devices. In step 602, a computer controlled robotic transfer device is used to mount the semiconductor light source 46 onto the circuit board 40. The semiconductor light source 46 may be mounted such that the light 48 is emitted from it in accordance with an illumination pattern. In step 604, a robotic transfer device is used to mount the encasing 42 into the cavity 44 of the circuit board 40. The encasing 42 is mounted such that the light 48 emitted from the semiconductor light source 46 can be received by an optical element (e.g., optical element 50) contained within the encasing 42. As such, the illumination module 36 can output the light 48 in accordance with an illumination pattern different from the illumination pattern of the light 48 emitted from the semiconductor light source 46.

In certain embodiments, the encasing 42 may contain the optical element 50, the optical element 54, or both, when mounted to the circuit board 40 by the robotic transfer device. In certain embodiments, the encasing 42 contains the wedge prism 60, the diffuser 66, or both, in combination with the optical elements 50 and 54 when the encasing 42 is mounted to the circuit board 40 by the robotic transfer device. Here, the optical components of the encasing 42 may be manually inserted in the assembly in a "top-down" manner. Specifically, the optical elements are inserted in the encasing 42 in the order of, first, the diffuser 66 (optional), then (optionally) the wedge prism 60, next the optical element 54, and lastly the optical element 50. The optical elements can be press-fit together and glued to the encasing 42.

Figure 7:
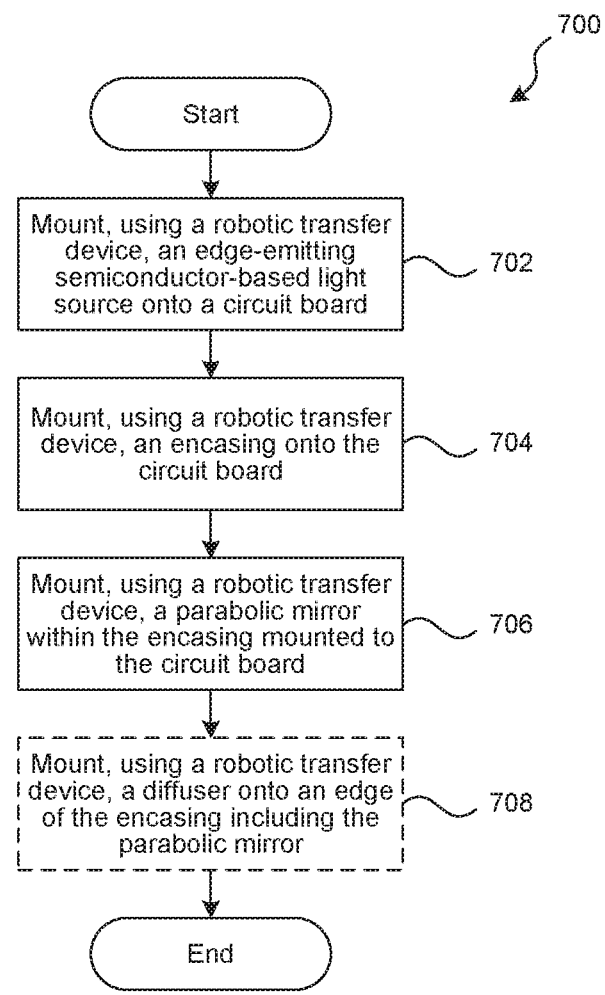
FIG. 7 illustrates another example of a method of manufacturing an illumination module by a computer controlled robotic transfer device.

FIG. 7 illustrates an example of a method 700 of manufacturing the illumination module 72 by one or more computer controlled robotic transfer device. In step 702, a computer controlled robotic transfer device is used to mount the semiconductor light source 80 to the circuit board 74. The semiconductor light source 80 is mounted such that the light 82 emitted therefrom is in accordance with a desired illumination pattern. In step 704, a robotic transfer device is used to mount the encasing 76 into the cavity 78 of the circuit board 74. The encasing 76 is mounted such that the light 82 emitted from the semiconductor light source 80 can be received by an optical element (e.g., parabolic mirror 86) of the encasing 76.

In step 706, a robotic transfer device is used to mount the parabolic mirror 86 within the encasing 76 mounted to the circuit board 74. The parabolic mirror 86 is mounted such that the light 82 emitted from the semiconductor light source 80 can be received by the optical surface 88 of the parabolic mirror 86 through the opening 84 of the encasing 76. As such, the illumination module 72 can output the light 82 in accordance with an illumination pattern different from the illumination pattern of the light 82 emitted from the semiconductor light source 80. For example, the light 82 output by the illumination module 72 may be collimated and redirected.

In step 708, the method 700 of manufacturing the illumination module 72 optionally includes using a robotic transfer device to mount the diffuser 90 to the ledge structure 92 of the encasing 76 containing the parabolic mirror 86. The diffuser 90 is mounted such that the light 82 received from the parabolic mirror 86 can be diffused by the diffuser 90. As such, the illumination module 72 can output the laser light 82 in accordance with an illumination pattern different from the illumination pattern of the laser light 82 emitted from the semiconductor light source 80.

For example, the light 82 output by the illumination module 72 may be collimated, redirected, and diffused. Here, the optical components of the encasing 76 may be inserted, using the robotic transfer device, in the encasing 76 in a "bottom-up" manner. Specifically, the optical elements can be inserted in the encasing 76 in the order of, first, the parabolic mirror 86, and followed (optionally) by the diffuser 90. In certain embodiments, the optical elements may be inserted manually or by using the robotic transfer device into the encasing 76 before being mounted into the cavity 78 of the circuit board 74.

The machine-implemented operations described above can be implemented at least partially by programmable circuitry programmed/configured by software and/or firmware, or entirely by special-purpose circuitry, or by a combination of such forms. Such special-purpose circuitry (if any) can be in the form of, for example, one or more application-specific integrated circuits (ASICs), programmable logic devices (PLDs), field-programmable gate arrays (FPGAs), system-on-a-chip systems (SOCs), etc.

Software or firmware to implement the embodiments introduced here may be stored on a machine-readable storage medium and may be executed by one or more general-purpose or special-purpose programmable microprocessors. A "machine-readable medium," as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium includes recordable/non-recordable media (e.g., read-only memory (ROM); random access memory (RAM); magnetic disk storage media; optical storage media; flash memory devices; etc.), etc.

EXAMPLES OF CERTAIN EMBODIMENTS

Certain embodiments of the technology introduced herein are summarized in the following numbered examples:

1. An illumination module comprising: a circuit board; an edge-emitting semiconductor-based light source mounted to the circuit board, to emit light in a first illumination pattern; an encasing mounted to the circuit board; and one or more optical surfaces at least partially contained within the encasing, the one or more optical surfaces collectively configured to receive the light from the edge-emitting semiconductor-based light source, to condition and redirect the light, and to output the conditioned and redirected light from the illumination module in a second illumination pattern different from the first illumination pattern.

2. The illumination module of example 1, wherein to condition the light comprises collimating the light, and different optical surfaces of the one or more optical surfaces are configured to separately collimate and redirect the light.

3. The illumination module of example 1 or example 2, wherein the edge-emitting semiconductor-based light source is an edge-emitting laser diode or one or more superluminescent light-emitting diodes.

4. The illumination module of any of examples 1 through 3, wherein the light emitted from the edge-emitting semiconductor-based light source is infrared light.

5. The illumination module of any of examples 1 through 4, wherein the first illumination pattern has a direction such that a parallel component of the direction relative to the circuit board is greater than a perpendicular component of the direction relative to the circuit board.

6. The illumination module of any of examples 1 through 5, wherein the first illumination pattern has a first direction and the second illumination pattern has a second direction, the first direction being substantially perpendicular to the second direction.

7. The illumination module of any of examples 1 through 6, wherein the one or more optical surfaces comprises at least four optical surfaces.

8. The illumination module of any of examples 1 through 7, wherein to condition the light comprises diffusing the light.

9. The illumination module of any of examples 1 through 8, wherein to redirect the light comprises at least one of reflectively redirecting or transmissively redirecting the light.

10. The illumination module of any of examples 1 through 9, wherein three different optical surfaces of the one or more optical surfaces are configured to separately collimate, reflectively redirect, and transmissively redirect the light.

11. The illumination module of any of examples 1 through 10, wherein the one or more optical surfaces are comprised in a plurality of optical elements, the plurality of optical elements including: a turning reflector contained within the encasing, to receive the light propagated from the edge-emitting semiconductor-based light source; and a collimation surface contained within the encasing, to receive the light from a turning reflector and to collimate the light such that the second illumination pattern comprises the collimated and redirected light.

12. The illumination module of any of examples 1 through 11, the plurality of optical elements further comprising: a wedge prism contained within the encasing, to receive the collimated light from the collimation surface and to transmissively redirect the collimated light such that the second illumination pattern comprises the collimated and transmissively redirected light.

13. The illumination module of any of examples 1 through 13, the plurality of optical elements further comprising: a diffuser at least partially contained within the encasing, to receive the collimated and transmissively redirected light from the wedge prism and to diffuse the collimated and transmissively redirected light such that the second illumination pattern comprises the collimated, transmissively redirected, and diffused light.

14. A near-to-eye display system comprising: a chassis; an illumination module mounted to the chassis, the illumination module comprising a circuit board, an edge-emitting semiconductor-based light source mounted to the circuit board, to emit light in a first illumination pattern, an encasing mounted to the circuit board, a turning reflector contained within the encasing, to receive the light propagated from the edge-emitting semiconductor-based light source; and a collimation surface contained within the encasing, to receive the light from the turning reflector and to collimate the light, the illumination module configured to output the collimated light in a second illumination pattern different from the first illumination pattern; a camera mounted to the chassis, to receive reflected light comprising at least a portion of the collimated and redirected light output by the illumination module; an imager to generate an image based on the reflected light; and at least one display to overlay the image on a view of an optical receptor of a user when the near-to-eye display system is worn by the user.

15. The near-to-eye display system of example 14, wherein the near-to-eye display system is a head-mounted display system.

16. The near-to-eye display system of example 14 or example 15, wherein the edge-emitting semiconductor-based light source is an edge-emitting laser diode, and the light emitted from the edge-emitting laser diode is infrared light.

17. The near-to-eye display system of any of examples 14 through 16, wherein the first illumination pattern has a first direction and the second illumination pattern has a second direction, the first direction being substantially perpendicular to the second direction.

18. The near-to-eye display system of any of examples 14 through 17, further comprising: a wedge prism contained within the encasing, to receive the collimated light from the collimation surface and to redirect the collimated light such that the second illumination pattern comprises the collimated and redirected light.

19. The near-to-eye display system of any of examples 14 through 18, further comprising: a diffuser at least partially contained within the encasing, to receive the collimated and redirected light from the collimation surface and to diffuse the collimated and redirected light such that the second illumination pattern comprises the collimated, redirected, and diffused light.

20. A method of manufacturing an illumination module by one or more computer controlled robotic transfer devices comprising: mounting, using a robotic transfer device, an edge-emitting semiconductor-based light source onto a circuit board; mounting, using a robotic transfer device, an encasing onto a cavity of the circuit board, the encasing including at least: a turning reflector to receive light propagated from the edge-emitting semiconductor-based light source; and a collimation surface to receive the light from the turning reflector and to collimate the light.

21. An illumination module comprising: a circuit board; an edge-emitting semiconductor-based light source mounted to the circuit board, to emit light in a first illumination pattern; an encasing mounted to the circuit board; and one or more optical surfaces at least partially contained within the encasing, the one or more optical surfaces including a single optical surface configured to receive, condition, and redirect the light from the edge-emitting semiconductor-based light source such that the one or more optical surfaces are collectively configured to output the conditioned and redirected light from the illumination module in a second illumination pattern different from the first illumination pattern.

22. The illumination module of example 21, wherein the edge-emitting semiconductor-based light source is an edge-emitting laser diode or one or more super-luminescent light-emitting diodes.

23. The illumination module of example 21 or example 22, wherein the light emitted from the edge-emitting semiconductor-based light source is infrared light.

24. The illumination module of any of examples 21 through 23, wherein the first illumination pattern has a direction such that a parallel component of the direction relative to the circuit board is greater than a perpendicular component of the direction relative to the circuit board.

25. The illumination module of any of examples 21 through 24, wherein the first illumination pattern has a first direction and the second illumination pattern has a second direction, the first direction being substantially perpendicular to the second direction.

26. The illumination module of any of examples 21 through 25, wherein the one or more optical surfaces comprises no more than three optical surfaces.

27. The illumination module of any of examples 21 through 26, wherein to condition the light comprises at least one of collimating or diffusing the light.

28. The illumination module of any of examples 21 through 27, wherein to redirect the light comprises reflectively redirecting the light.

29. The illumination module of any of examples 21 through 28, wherein a single optical surface of the one or more optical surfaces is configured to collimate the light and to reflectively redirect the light.

30. The illumination module of any of examples 21 through 29, wherein the edge-emitting semiconductor-based light source is mounted to a first plane of the circuit board and the encasing is mounted to a second plane of the circuit board, the second plane being different from the first plane.

31. The illumination module of any of examples 21 through 30, wherein the edge-emitting semiconductor-based light source is mounted to the circuit board at a location external to the encasing.

32. The illumination module of any of examples 21 through 31, wherein the one or more optical surfaces are comprised in one or more optical elements, the one or more optical elements including: a parabolic mirror contained within the encasing, to receive the light from the edge-emitting semiconductor-based light source and to collimate and redirect the light received from the edge-emitting semiconductor-based light source such that the second illumination pattern includes the collimated and redirected light.

33. The illumination module of any of examples 21 through 32, the plurality of optical elements further comprising: a diffuser at least partially contained within the encasing, to receive the collimated and redirected light from the parabolic mirror and to diffuse the collimated and redirected light such that the second illumination pattern comprises the collimated, redirected, and diffused light.

34. A near-to-eye display system comprising: a chassis; an illumination module mounted to the chassis, the illumination module comprising: a circuit board; an edge-emitting semiconductor-based light source mounted to the circuit board, to emit light in a first illumination pattern; an encasing mounted to the circuit board; and a parabolic mirror contained within the encasing, to receive the light from the edge-emitting semiconductor-based light source and to collimate and redirect the light, the illumination module configured to output the collimated and redirected light in a second illumination pattern different from the first illumination pattern; a camera mounted to the chassis, to receive reflected light comprising at least a portion of the collimated and redirected light output by the illumination module; an imager to generate an image based on the reflected light; and at least one display to overlay the image on a view of an optical receptor of a user when the near-to-eye display system is worn by the user.

35. The near-to-eye display system of example 34, wherein the near-to-eye display system is a head-mounted display system.

36. The near-to-eye display system of example 34 or example 35, wherein the edge-emitting semiconductor-based light source is an edge-emitting laser diode, and the light emitted from the edge-emitting laser diode is infrared light.

37. The near-to-eye display system of any of examples 34 through 36, wherein the first illumination pattern has a first direction and the second illumination pattern has a second direction, the first direction being substantially perpendicular to the second direction.

38. The near-to-eye display system of any of examples 37 through 38, further comprising: a diffuser at least partially contained within the encasing, to receive the collimated and redirected light from the parabolic mirror and to diffuse the collimated and redirected light such that the second illumination pattern comprises the collimated, redirected, and diffused light.

39. A method of manufacturing an illumination module by one or more computer controlled robotic transfer devices, the method comprising: mounting, using a robotic transfer device, an edge-emitting semiconductor-based light source onto a circuit board; mounting, using a robotic transfer device, an encasing onto a cavity of the circuit board; and mounting, using a robotic transfer device, a parabolic mirror within the encasing mounted to the circuit board.

40. The method of example 40, further comprising: mounting, using a robotic transfer device, a diffuser onto a ledge of the encasing including the parabolic mirror.

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that (i) the methods/steps described herein may be performed in any sequence and/or in any combination, and that (ii) the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. A near-to-eye display system of comprising:
a chassis;
an illumination module mounted to the chassis, the illumination module including:
a circuit board;
an edge-emitting semiconductor-based light source mounted to the circuit board, to emit light in a first illumination pattern;
an encasing mounted to the circuit board;
a turning reflector contained within the encasing, to receive the light propagated from the edge-emitting semiconductor-based light source; and
a collimation surface contained within the encasing, to receive the light from the turning reflector and to collimate the light; and
a wedge prism contained within the encasing, to receive the collimated light from the collimation surface and to redirect the collimated light to output the collimated and redirected light in a second illumination pattern different from the first illumination pattern;
a camera mounted to the chassis, to receive reflected light including at least a portion of the collimated and redirected light output by the illumination module;
an imager to generate an image based on the reflected light;
at least one display to overlay the image on a view of an optical receptor of a user when the near-to-eye display system is worn by the user.

2. The near-to-eye display system of claim 1, wherein the edge-emitting semiconductor-based light source is an edge-emitting laser diode or one or more super-luminescent light-emitting diodes.

3. The near-to-eye display system of claim 1, wherein the first illumination pattern has a direction such that a parallel component of the direction relative to the circuit board is greater than a perpendicular component of the direction relative to the circuit board.

4. The near-to-eye display system of claim 1, wherein to redirect the light comprises at least one of reflectively redirecting or transmissively redirecting the light.

5. The near-to-eye display system of claim 1, wherein the near-to-eye display system is a head-mounted display system.

6. The near-to-eye display system of claim 1, wherein the edge-emitting semiconductor-based light source is an edge-emitting laser diode, and the light emitted from the edge-emitting laser diode is infrared light.

7. The near-to-eye display system of claim 1, wherein the first illumination pattern has a first direction and the second illumination pattern has a second direction, the first direction being different from the second direction.

8. A near-to-eye display system comprising:
a chassis;
an illumination module mounted to the chassis, the illumination module including:
a circuit board;
an edge-emitting semiconductor-base light source mounted to the circuit board, to emit light in a first illumination pattern;
an encasing mounted to the circuit board;
a turning reflector contained within the encasing, to receive the light propagated from the edge-emitting semiconductor-based light source;
a collimation surface contained within the encasing, to receive the redirected light from the turning reflector and to collimate the light; and
a diffuser at least partially contained within the encasing, to receive the collimated and redirected light from the collimation surface and to diffuse the collimated and redirected light to output the collimated, redirected, and diffused light in a second illumination pattern different from the first illumination pattern;
a camera mounted to the chassis, to receive reflected light including at least a portion of the redirected, collimated, and diffused light output by the illumination module;
an imager to generate an image based on the reflected light; and
at least one display to overlay the image on a view of an optical receptor of a user when the near-to-eye display system is worn by the user.

9. The near-to-eye display system of claim 8, wherein the edge-emitting semiconductor-based light source is an edge-emitting laser diode or one or more super-luminescent light-emitting diodes.

10. The near-to-eye display system of claim 8, wherein the first illumination pattern has a direction such that a parallel component of the direction relative to the circuit board is greater than a perpendicular component of the direction relative to the circuit board.

11. The near-to-eye display system of claim 8, wherein to redirect the light comprises at least one of reflectively redirecting or transmissively redirecting the light.

12. The near-to-eye display system of claim 8, wherein the near-to-eye display system is a head-mounted display system.

13. The near-to-eye display system of claim 8, wherein the edge-emitting semiconductor-based light source is an edge-emitting laser diode, and the light emitted from the edge-emitting laser diode is infrared light.

14. The near-to-eye display system of claim 8, wherein the first illumination pattern has a first direction and the second illumination pattern has a second direction, the first direction being different from the second direction.

* * * * *